United States Patent
Schmidt et al.

(10) Patent No.: US 6,593,756 B1
(45) Date of Patent: Jul. 15, 2003

(54) TACTILE SENSOR

(75) Inventors: Peer Schmidt, Bochum (DE); Eric Maël, Berlin (DE); Rolf Würtz, Bochum (DE)

(73) Assignee: Rubitec Gesellschaft für Innovation und Technologie der Ruhruniversität Bochum mbH, Bochum (DE)

( * ) Notice: Subject to any disclaimer, the term of this patent is extended or adjusted under 35 U.S.C. 154(b) by 0 days.

(21) Appl. No.: 09/869,285
(22) PCT Filed: Dec. 11, 1999
(86) PCT No.: PCT/EP99/09834
§ 371 (c)(1), (2), (4) Date: Sep. 28, 2001
(87) PCT Pub. No.: WO00/39927
PCT Pub. Date: Jul. 6, 2000

(30) Foreign Application Priority Data

Dec. 23, 1998 (DE) .......................... 198 59 779

(51) Int. Cl.[7] .............................................. G01R 27/26
(52) U.S. Cl. ........................ 324/686; 324/661; 901/33
(58) Field of Search ................ 73/172, 728; 324/661, 324/662, 686; 901/33

(56) References Cited

U.S. PATENT DOCUMENTS

| | | | |
|---|---|---|---|
| 4,404,481 A | | 9/1983 | Toshimine et al. |
| 4,405,197 A | * | 9/1983 | Bejczy .................... 385/15 |
| 4,766,389 A | * | 8/1988 | Rhoades et al. ........... 324/662 |
| 4,792,715 A | * | 12/1988 | Barsky et al. .......... 310/316.01 |
| 5,279,163 A | * | 1/1994 | D'Antonio et al. ........... 73/728 |
| 5,631,861 A | * | 5/1997 | Kramer ...................... 703/7 |

FOREIGN PATENT DOCUMENTS

EP 0 535 907 4/1993

OTHER PUBLICATIONS

Interlink Electronics Europe (*1990*) G. D. de Luxembourg "Force and Position Senors: A Rising Technology" (Enclosed).

\* cited by examiner

*Primary Examiner*—N. Le
*Assistant Examiner*—Walter Benson
(74) *Attorney, Agent, or Firm*—Collard & Roe, P.C.

(57) ABSTRACT

The invention relates to a tactile sensor in which a fiber (1) is linked with an instrument transformer (4) which is configured as a capacitor in such a manner that if the free end of the fiber is touched by an object, the touch is converted to electric signals. The force acting between the object and the sensor is kept at a minimum by using soft, elastic fibers. The inventive tactile sensor is especially useful for applications in robotics since due to the appropriate arrangement of the sensor on the contact surface of the robot gripper the sensor function is independent of any forces that might occur during the manipulation of objection. Another advantage of the tactile sensor is that it allows the dynamic registration of touches, thereby making it possible to determine the relative speed between the sensor and the object and to detect gliding or slipping movements on the basis of detected vibrations.

13 Claims, 4 Drawing Sheets

TACTILE SENSOR

CROSS REFERENCE TO RELATED APPLICATIONS

Applicants claim priority under 35 U.S.C. §119 of German Application No. 198 59 779.7, filed: Dec. 23, 1998. Applicants also claim priority under 35 U.S.C. §120 of PCT/EP99/09834, filed: Dec. 11, 1999. The international application under PCT article 21(2) was not published in English.

The invention relates to a device for registering contacts, comprising at least one force-sensitive transducer, whereby the force is coupled to the transducer via a fiber or a fiber bundle.

Tactile sensors are employed where ever interactions between a contact surface and the environment are to be measured and registered. In the simplest case, such tactile sensors serve the purpose of detecting contacts. In conjunction with the manipulations occurring in the field of robotics, such tactile sensors are expected to substitute for the sense of touch of humans and supply adequate information about the interaction occurring between the contact surface (the gripper or finger) and the sensed objects, so that movements and grips can be planned.

Different sensors are known with which tactile impressions can be technically registered (tactile sensors). The interaction with an object leads in this connection to a change in a quantity that is characteristic of the tactile sense. The change in such a quantity can be interpreted with the help of a suitable method.

It is possible to obtain static and/or dynamic tactile information depending on the engineering principle of such sensors.

Known sensors for accommodating tactile sensors are described in the following.

It is known that normal and shear forces can be measured via a capacitive cell, whereby normal forces are registered by changing the spacing between the electrodes as ell as the forces of shear by displacing the electrodes against one another (FAN, L. S., WHIT, R. M., and MULLER, R. S., 1984: "A Mutual Capacitive Normal- and Shear-Sensitive Tactile Sensor". IEEE Int. Electron. Devices Mg; pages 220–222).

Normal forces can be measured also by means of piezoresistive sensors. The firm Interlink-Electronics manufactures a foil that is imprinted with a semiconductive polymer, the resistance of which diminishes when pressure is acting on it. Such resistance can be measured with electrodes located underneath the foil (Interlink Electronics Europe 1990, G. D. de Luxembourg, "Pressure and Position Sensors: A Rising Technology").

Vibrations can be measured with piezoelectric sensors by converting the occurring vibrations into an electrical voltage with the help of a piezoelectric material. Such electrical voltage can be interpreted by means of suitable methods. (JOCUSCH, 1996, "Taktile Sensorik für eine Roboterhand" [Tactile Sensorics for a Robot hand]; Technische Universität Bielefeld).

Dynamic information via approximated speed between the sensor and the object can be registered with inductive sensors. For example, it is possible to work two coils into an elastic material and to evaluate the changes occurring in the magnetic coupling in the presence of a change in the geometry. Furthermore, static measurements are possible in this manner as well (PEURA, R. A., 1978, "Basic Transducers and Principles", in: J. G. Webster (ed.), Medical Instrumentation: Application and Design; Boston; Housten Mifflin).

A device of the type specified above is described in DE 42 40 531 C1. Said device is an input device for a computer and is designed in the form of a glove fitted with sensors. The known device serves for the registration of position and movement data of a hand and for transmitting such data to a computer. The known input device, furthermore, comprises contact sensors that serve for measuring the pressure distribution. As a sensor for determining the angle of deflection of the finger joints, the known device proposes as a transducer a coil that surrounds an immersion core that is movably supported in the coil. A flexible fiber is secured on the immersion core and transmits tensile and shear forces, so that the inductivity of the coil is changed by the movement of the immersion core when the finger joints are deflected. As tactile sensors, the known data glove is using pressure sensors designed in the form of flat capacitors whose plates can be moved against one another in an elastic manner when force is acting upon such plates. Different forces acting on the capacitor surfaces ensue different capacity values, which is exploited for determining the pressure acting on the plates.

The receptive elements of all sensors known heretofore are located either within the contact surface and come into direct contact with the sensed object, or the contact surface itself consists of a flexible layer and the receptive elements of the sensors are located directly underneath said layer. Such coupling between the receptive element and the sensed object suffices for static sensors whose function is to measure the forces.

However, dynamic sensors that are expected to register contact, speed and/or vibration are subjected to limitations on account of such coupling.

The mechanical properties of a contact surface are determined by the materials employed. Various goals can be pursued in this connection depending on the type of application. For example, in connection with contact with objects it may be desirable to build up a pressure as rapidly as possible or to achieve also as deep an impression as possible and to reduce the pressure in this connection only gradually, for example in order to permit the best possible adaptation to the object. Dynamic sensors are expected in this connection to take measurements, but not to determine the mechanical properties of the contact surface. However, this is in fact assured in connection with an arrangement in which conventional sensors are located beneath a flexible contact surface; however, the sensitivity and the accuracy of dynamic sensors are in this connection highly reduced, and are, furthermore, dependent upon the properties of the contact surface. With an arrangement that permits direct contact of the receptive elements with the contact surface, it is in fact possible to embed sensors within a flexible layer; however, such a flexible layer does not offer the stability required for providing it with any desired flexibility. The properties of the contact surface are in this connection decisively determined by the embedded sensors, and the distance from the contact to the build-up of a high pressure is in this connection generally only very short. Measurements are possible in each case only after the object has already touched the contact surface. To the extent to which no direct contact with the surface and contact surface takes place in the site of the sensor because of the geometric circumstances, no coupling of the sensor and the receptive element exists, and no measurements are possible.

Furthermore, the size and the type of coupling of the receptive elements of the known sensors does not allow obtaining any information about the surface structure of an object by scanning, unless such surface structure is quite rough.

The present invention is based on the following problems:

The goal is to register contacts dynamically, whereby the forces exerted on the sensed object are as low as possible. It should be nonetheless possible to exert on the object via a contact surface forces. However, such forces are to be independent of the interaction occurring between the object and the tactile sensor. It should be possible in this connection to collect tactile information before the object comes into contact with the contact surface. Furthermore, coupling between the sensor and the object is to be safely assured irrespectively of the geometric circumstances. Moreover, the tactile sensor should be suited for collecting information about the surface structure of an object.

For solving said problem, the invention proposes that the transducer converts the force acting on the fiber by means of a capacitor into electrical signals, whereby the fiber is mechanically coupled with one end to a first electrode of the capacitor, said electrode being displaceable in relation to a second electrode.

The special advantage offered by the device as defined by the invention consists in that the tactile impression is received via the free end of the fiber, whereby it is made possible owing to the mechanical coupling to the transducer to arrange the capacitor or capacitors underneath a contact surface, or around the edges of a contact surface. The fibers may be installed in this connection, for example through holes provided in the contact surface, reaching up to the surface of the latter, or may alternatively project beyond the edges of the contact surface sideways in order to produce a coupling between the sensed object and the tactile sensor in this way without impairing the interaction between the contact surface and the object.

The advantages obtained with the invention are especially based on the fact that the force that the sensor exerts on the object is dependent only upon the quality of the fibers. Natural fibers (e.g. animal hair) or synthetic fibers of any type can be employed depending on the type of application involved. When a soft fiber material is used, it is possible to register the contact, the speed and/or the vibrations with the use of suitable transducers, whereby the force transmitted from the fibers to the object is always very low, depending more or less on the spacing between the transducer and the object, and almost exclusively dependent upon the properties of the fibers. The sensors whose transducers are brought into contact with the sensed object via the fibers can be employed for purely scanning objects as well, without such fibers coming into contact with a contact surface. Even if the object is in contact with a contact surface, if need be, contacts can be dynamically registered without the sensor impairing the properties of the contact surface in any decisive manner.

The sites detected or covered by the sensor can be predetermined by selecting the thickness, the number and the arrangement of the fibers, so that fine surfaces can be sensed as well, if need be.

The device as defined by the invention, in conjunction with which a capacitor comprising a movable electrode and serving as the transducer is mechanically coupled to a fiber, can be realized with simple means and at favorable cost. Due to the mechanical coupling between the fiber and capacitor electrode, the capacity is changed when a force is effected on the fiber. Any contact of the free end of the tactile fiber with an object is converted in this way into an electrical signal.

It is advantageous, on the one hand, that with the tactile sensor as defined by the invention, the sensitivity can be easily varied and adapted to the fibers used. Furthermore, the dimensions of the capacitors can be extremely small, which makes it possible to mount a multitude of tactile sensors as defined by the invention in a space-saving manner, for example on a gripping arm of a robot.

The benefits specified above result in multifacetted application possibilities of the present invention in the fields of robotics and automation as, well in all fields where the recording of dynamic tactile impressions plays a role.

A useful embodiments of the device as defined by the invention that can be realized with simple means, is obtained if the transducer is configured in the form of a capacitor according to claim 2. By mechanically coupling the fiber to the capacitor electrode, the capacity acting on the fiber is changed when a force is applied. Any contact of the free end of the tactile fiber with an object is converted in this way into an electrical signal. Possibilities for technical realizations comprise that either the rigid electrodes of the capacitor can be moved in relation to each other, whereby it is possible, for example according to claim 4 to support one of the movable electrodes in an elastic manner, or that the electrode being in connection with the fiber consists of an elastically deformable material in accordance with claim 5. In such embodiments, the sensitivity of the tactile sensor can be easily varied and adapted to the fibers used.

The movements of the capacitor electrodes triggered by the fibers can be evaluated in a simple manner, whereby is it useful according to claim 6 to make provision for a means for measuring the capacity with time resolution for registering dynamic tactile information. It is possible with the help of such tactile information to determine, for example the relative speed between the tactile sensor and an object.

The use of a frequency-selective filter permits detecting in a simple manner vibrating tactile signals such as they are caused, for example by gliding or sliding objects.

If, according to claim 8, suitable means for electronic data acquisition and evaluation are employed for evaluating the measurement signals, it is in particular possible in association with claims 9 to 11 to counterbalance the tactile information data of two or more transducers, in a way such that contact detection is made possible with site or local resolution. For this purpose, it is necessary that the elements, which are arranged flat or in the form of a line as required, can be wired in a suitable manner. This entails the possibility that the form and orientation of an object can be determined, on the one hand, and also its direction of movement on the other.

The combination of the tactile sensor as defined by the invention with additional sensors without fibers makes it possible to build up a tactile sensor system by which static and dynamic tactile impressions can be registered simultaneously. The additional force sensor can be realized in this connection in the form of a contact surface, which is advantageous, for example for applications in the field of robotics. With a robot gripper equipped with such a combination of sensors it is possible to realize a tactile feedback that is optimal for the manipulation of objects.

Advantageous technical realization possibilities are specified in claims 13 to 15. According to claim 13, the fiber sensors are arranged underneath a flat force sensor, whereby the fibers penetrate its detection plane. Static and dynamic tactile impressions can be registered in this manner on the contact surface at each point. Arranging the fiber sensors on the edge of the flat force sensor can be realized in a simpler way. Local resolution of the dynamic tactile information is limited in such an arrangement accordingly. According to claim 15, the use of a piezo-resistive foil is suitable for the additional force sensor in an advantageous manner.

Exemplified embodiments of the present invention are discussed in the following with the help of FIGS. 1 to 8 of the drawing, in which.

Figures 1A, 1B, 1C:
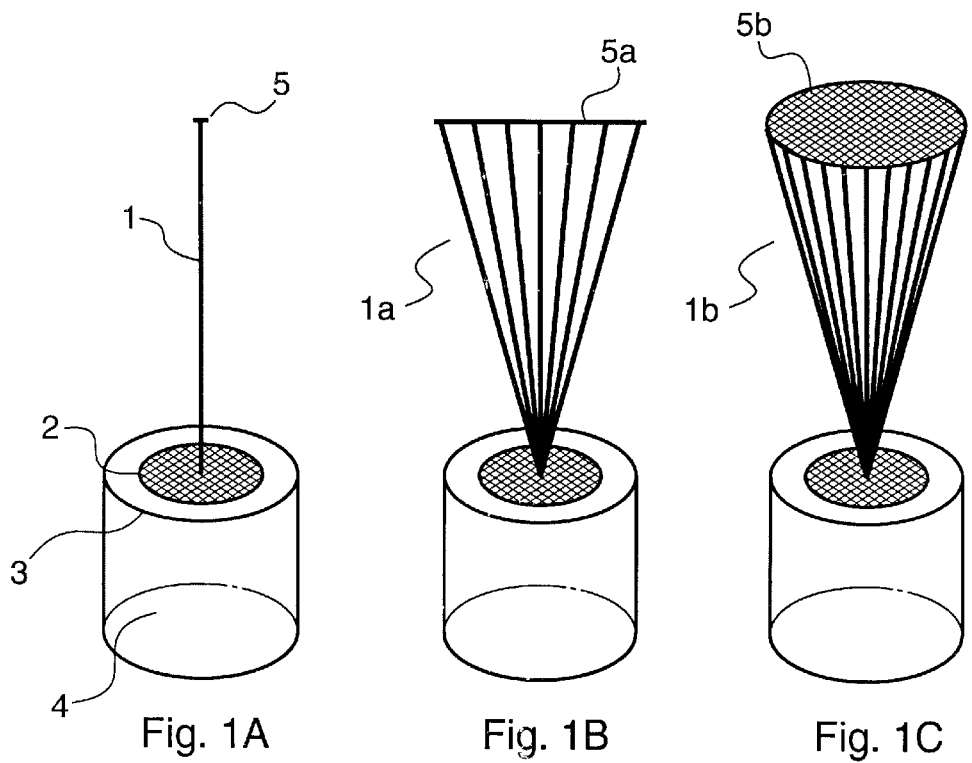
FIG. 1 shows a diagrammatic sketch of the tactile sensor as defined by the invention.

FIG. 1 shows a diagrammatic sketch of the different possible arrangements of tactile fibers (1, 1A, 1B) located on a force-sensitive transducer (4). By arranging the fibers (1, 1A, 1B) in different ways, it is possible to vary the surface (5, 5A, 5A) detected by the sensor. The sensor itself has to be adequately sensitive in this connection for being capable of registering the forces transmitted via the fibers. The connection (2) between the receptive element (3) and the tactile fibers (1, 1A, 1B) may be produced via suitable materials (e.g. silicone resin, rubber).

Figures 2A, 2B:
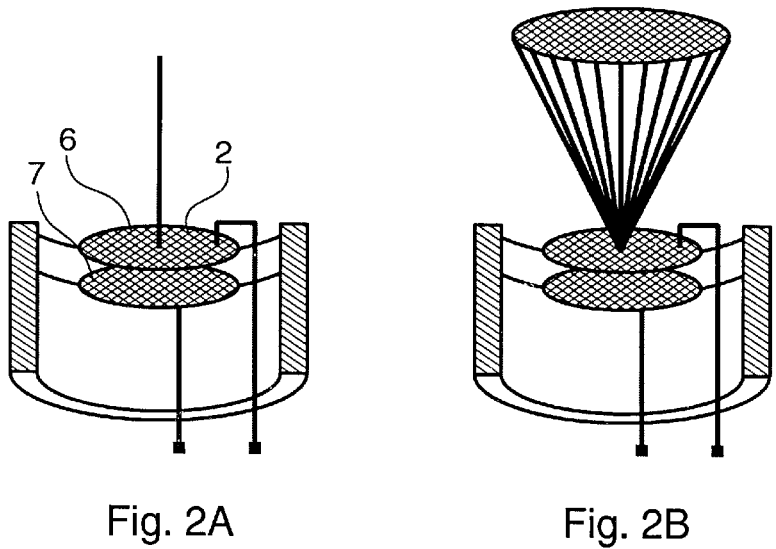
FIG. 2 is a schematic drawing comprising capacitive transducers.

FIG. 2 shows a tactile sensor in conjunction with which the transducer consists of a plate capacitor whose upper plate (6) is suspended in a flexible manner and capable of changing the spacing from the lower plate (7). The selection of a plate capacitor as the transducer makes it possible to manufacture also very small sensors which, furthermore, are capable of registering even very low forces acting on the capacitor electrode, and of perceiving vibrations registered via the fibers.

Figure 3:
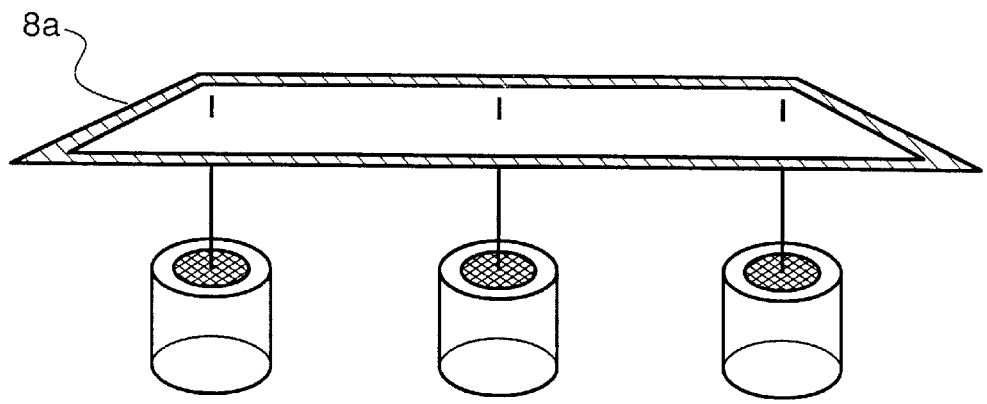
FIG. 3 shows an arrangement of fiber sensor underneath a contact surface.

FIG. 3 shows an arrangement of three tactile sensors underneath a contact surface (8A). The drilled holes hardly cause any change in the properties of the contact surface, and the sensors can be arranged below the contact surface at any desired depth. For applications on robot grippers, for example, it is possible to register the contact with objects. By registering vibrations, it is possible to register any objects present on the contact surface that start to slide, or to register objects touching the contact surface. By changing the fiber length it is possible to register objects that are present within the proximity before such objects actually come into contact with the contact surface (8A), and to react accordingly, which can be exploited, for example for recognizing obstructions within the range of movement of a robot.

Figure 4:
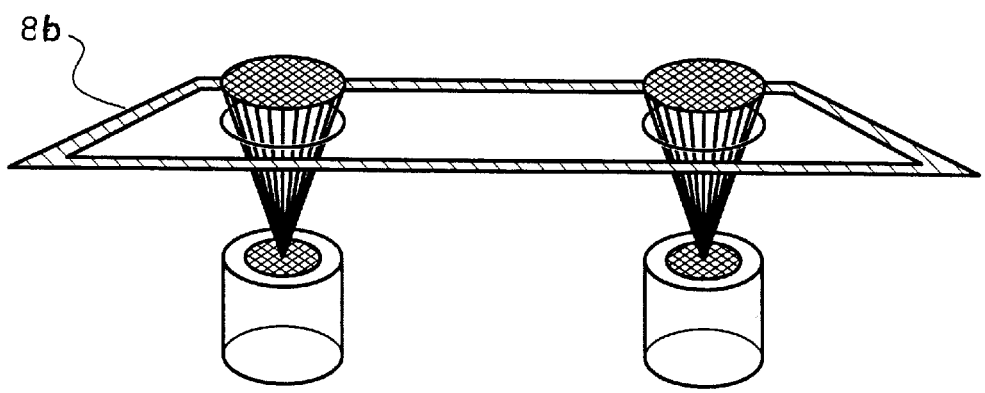
FIG. 4 shows an arrangement of sensors with fiber bundles underneath the contact surface.

FIG. 4 shows another arrangement of tactile fibers underneath a contact surface (8B). It may be useful to changer the size and the shape of the surface detected by the sensor depending on the application, which is possible by simply adapting the arrangement of the fibers as required.

Figure 5:
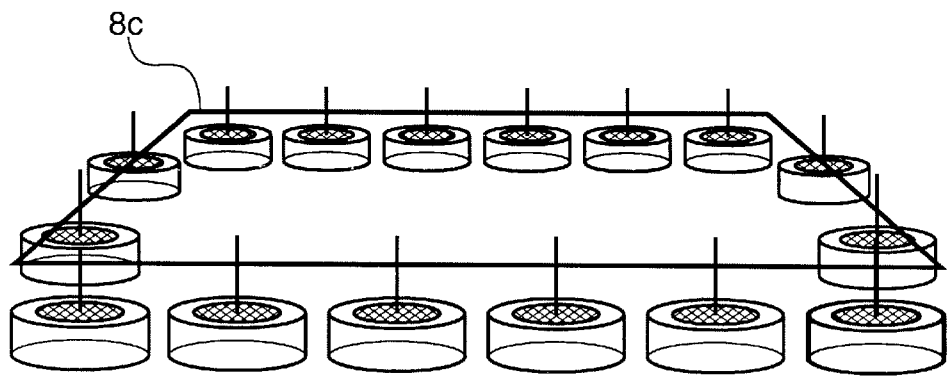
FIG. 5 shows an arrangement of fiber sensors along the edges of a contact surface.

FIG. 5 shows an arrangement of sensors along the edge of a contact surface (8C). by evaluating the sensor signals in it is possible in this way to determined the alignment of the contact surface in relation to the object in a very simple manner. This can be exploited for controlling the alignment of the gripper of a robot.

Figure 6:
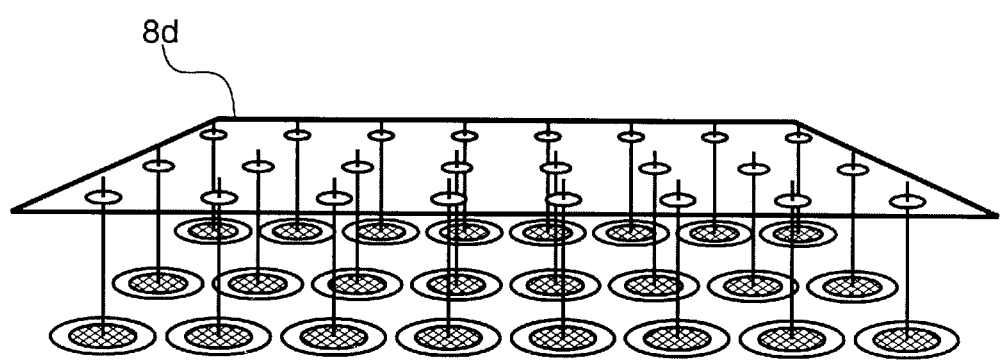
FIG. 6 shows a two-dimensional arrangement of a multitude of fiber sensors underneath a contact surface.

FIG. 6 shows the two-dimensional arrangement of sensors underneath a contact surface (8D), whereby the properties of the contact surface are changed by the drilled holes only in minor ways. The contact surface is in this connection not necessarily plane. The arrangement makes it possible to determine dynamic tactile information of an object being in contact with the contact surface at any point of the contact surface.

Figure 7:
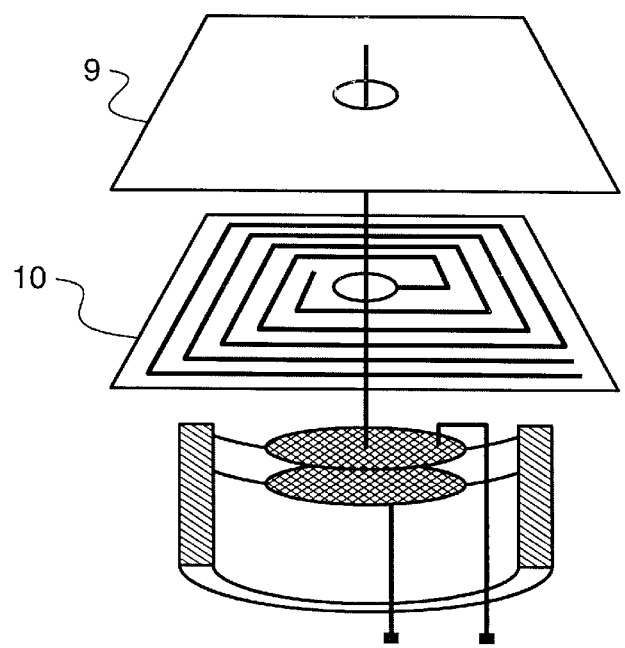
FIG. 7 shows a fiber sensor underneath a piezoresistive force sensor.

FIG. 7 shows a combination of a tactile sensor as defined by the invention with an additional static sensor. Said sensor, which is comprised of two foils arranged one on top of the other, changes its electrical resistance because of the pressure acting on it. The lower foil is provided with electrodes via which the resistance of the upper foil can be measured. Thus it is possible to determine the force acting on the upper foil with local resolution. The combination of the two types of sensor makes it possible to simultaneously obtain information about static forces and about the speed and the vibration.

Figure 8A:
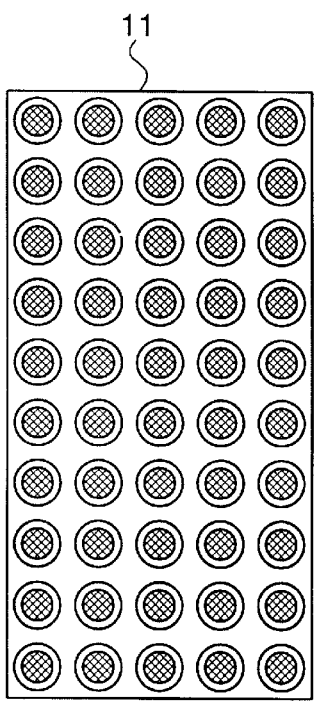
FIG. 8 shows an arrangement comprising a multitude of fiber sensors underneath an arrangement of piezoresistive force sensors.
Figure 8B:
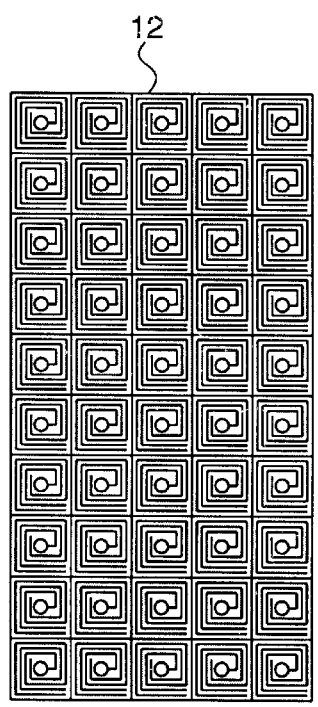
Figure 8C:
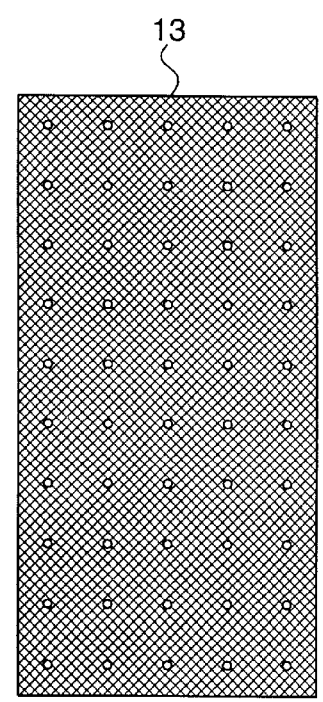

FIG. 8 shows the basic structure of an arrangement comprising dynamic sensors (11) that are arranged underneath a static sensor field (12, 13). The figure shows a top view of the base plate (11) with the fiber sensors integrated on said plate. The fibers are passed through the holes in the electrode layer (12) and the foil layer (13) of the static sensor field and extended to the surface.

What is claimed is:

1. A device for registering contacts, comprising at least one force-sensitive transducer (4), whereby the force is coupled to the transducer (4) via a fiber (1) or a fiber bundle (1A, 1B), characterized in that the transducer (4) converts the force acting on the fibers (1) into electrical signals by means of a capacitor, whereby the fiber is mechanically coupled with one end to a first electrode (6) of the capacitor, said electrode being displaceable in relation to a second electrode (7).

2. The device according to claim 1, characterized in that the displaceable electrode (7) is supported in an elastic manner.

3. The device according to claim 1, characterized in that the displaceable electrode (7) consists of an elastically deformable material.

4. The device according to claim 1, characterized in that provision is made for a means for measuring the capacity of the capacitor with time resolution.

5. The device according to claim 4, characterized in that the time curve of the capacity is recorded by means of at least one frequency-selective filter.

6. The device according to claim 1, characterized in that the transducer is coupled to a means for electronic data acquisition and evaluation.

7. The device according to claim 6, characterized in that for evaluating tactile information, the measurement data of two or more transducers are accounted with each other.

8. The device according to claim 1, characterized in that a multitude of transducers each having a fiber (1) or a fiber bundle (1A, 1B) associated with it are arranged to form a plane or line-shaped sensor.

9. The device according to claim 8, characterized in that the transducers are wired in such a way that contact detection with local resolution is made possible.

10. The device according to claim 1, characterized in that transducers each provided with fibers (1) or fiber bundles (1A, 1B) are combined with at least one additional force sensor without fibers.

11. The device according to claim 10, characterized in that one or a plurality of fibers penetrate the detection plane of a flat force sensor.

12. The device according to claim 10, characterized in that a multitude of transducers with fibers or fiber bundles are arranged on the edge of a flat force sensor.

13. The device according to claim 20, characterized in that the additional force sensor comprises a piezoresistive foil.

* * * * *